(12) United States Patent
Murison et al.

(10) Patent No.: US 7,796,654 B2
(45) Date of Patent: Sep. 14, 2010

(54) SEED SOURCE FOR HIGH POWER OPTICAL FIBER AMPLIFIER

(75) Inventors: Richard Murison, St-Lazare (CA); Tullio Panarello, St-Lazare (CA); Benoit Reid, Laval (CA); Reynald Boula-Picard, Montreal (CA)

(73) Assignee: PyroPhotonics Lasers Inc., Dollard-des-Ormeaux, Quebec (CA)

( * ) Notice: Subject to any disclaimer, the term of this patent is extended or adjusted under 35 U.S.C. 154(b) by 38 days.

(21) Appl. No.: 12/015,427

(22) Filed: Jan. 16, 2008

(65) Prior Publication Data
US 2009/0080477 A1 Mar. 26, 2009

Related U.S. Application Data

(60) Provisional application No. 60/885,604, filed on Jan. 18, 2007.

(51) Int. Cl.
*H01S 3/30* (2006.01)
(52) U.S. Cl. .............................................. 372/6; 372/25
(58) Field of Classification Search .................. 372/6, 372/25
See application file for complete search history.

(56) References Cited

U.S. PATENT DOCUMENTS

| | | | | |
|---|---|---|---|---|
| 5,200,964 | A * | 4/1993 | Huber | 372/26 |
| 5,400,350 | A * | 3/1995 | Galvanauskas | 372/20 |
| 5,745,284 | A * | 4/1998 | Goldberg et al. | 359/344 |
| 6,590,910 | B2 | 7/2003 | Lin | |
| 6,678,294 | B1 | 1/2004 | Komine et al. | |
| 2005/0036525 | A1* | 2/2005 | Liu | 372/6 |
| 2005/0041702 | A1* | 2/2005 | Fermann et al. | 372/25 |
| 2006/0159138 | A1* | 7/2006 | Deladurantaye et al. | 372/25 |

OTHER PUBLICATIONS

International Search Report and Written Opinion of PCT Application No. PCT/CA2008/000104, dated Apr. 17, 2008, 11 pages total.

* cited by examiner

*Primary Examiner*—Minsun Harvey
*Assistant Examiner*—Joshua King
(74) *Attorney, Agent, or Firm*—Townsend and Townsend and Crew LLP

(57) ABSTRACT

Methods and systems are provided to reduce stimulated Brillouin scattering in high power optical fiber amplifiers. In an embodiment, a seed source includes a narrow linewidth semiconductor laser driven with a current ramp that simultaneously sweeps the optical power and the lasing frequency at a rate fast enough to reduce stimulated Brillouin scattering.

10 Claims, 8 Drawing Sheets

SEED SOURCE FOR HIGH POWER OPTICAL FIBER AMPLIFIER

CROSS-REFERENCES TO RELATED APPLICATIONS

The present application claims benefit under 35 U.S.C. §119(e) of U.S. Provisional Patent Application No. 60/885,604, filed Jan. 18, 2007, entitled "Seed Source for High Power Optical Fiber Amplifier," the disclosure of which is hereby incorporated by reference in its entirety.

BACKGROUND OF THE INVENTION

The present invention relates generally to the field of optical amplifiers and lasers. More particularly, the present invention relates to a method and apparatus for providing high power pulsed laser sources useful for various applications including industrial applications such as trimming, marking, cutting, and welding. Merely by way of example, the methods and systems of the present invention have been applied to broaden the apparent laser linewidth in order to reduce Stimulated Brillouin Scattering. But it would be recognized that the invention has a much broader range of applicability.

Conventional laser-based material processing has generally used high peak power pulsed lasers, for example, Q-switched Nd:YAG lasers operating at 1064 nm, for marking, engraving, micro-machining, and cutting applications. More recently, laser systems based on fiber gain media have been developed. In some of these fiber-based laser systems, fiber amplifiers are utilized.

Some optical amplifiers and lasers utilizing a fiber gain medium are optically pumped, often by using semiconductor lasers pumps. The fiber gain medium is typically made of silica glass doped with rare-earth elements. The choice of the rare-earth elements and the composition of the fiber gain medium depend on the particular application. One such rare-earth element is ytterbium, which is used for optical amplifiers and lasers emitting in the 1020 nm-1100 nm range. Another rare-earth element used in some fiber gain media is erbium, which is used for optical amplifiers and lasers emitting in the 1530 nm-1560 nm range.

The wavelength of the optical pump source used for ytterbium-doped fiber amplifiers and lasers is typically in the wavelength range of 910 nm to 980 nm. The wavelength of the optical pump source used for erbium-doped fiber amplifiers and lasers is typically in a wavelength range centered at about 980 nm or about 1480 nm.

Because optical fibers usually have small diameters, they tend to be prone to optical nonlinear effects degrading the amplifier performance, especially in high peak power pulsed operation. The nonlinear effect threshold depends on the optical intensity, which is given by the ratio of the peak optical power to the optical beam cross-section. Since, in a number of optical fibers, the beam cross-section is small, the optical peak power to reach the nonlinear threshold can also be small. Optical nonlinear effects can also be present in bulk optical amplifiers using, for example, rods as the gain media, but since the beam diameter is much larger than in optical fibers, the optical peak power to reach the nonlinear threshold is likewise much larger in bulk optical amplifiers than in optical fibers.

One such optical nonlinear effect that has been observed to limit the output power in an optical fiber amplifier is Stimulated Brillouin Scattering (SBS). High intensity pulses in optical fibers generate high frequency sound waves, which periodically modify the index of refraction of the fiber, hence creating a moving Bragg grating. Bragg gratings can be used to couple different beams of light, one to another. In the particular case of SBS, the effect of the moving Bragg grating is to couple the incident signal light to a counter-propagating wave having a frequency down-shifted by the frequency of the sound wave, which is typically ~10 GHz. Wave coupling results in energy being exchanged between the two waves. If the intensity of the incident wave is high enough, SBS in effect enables it to provide a very substantial amount of gain to the counter-propagating wave. In real-world high-power fiber lasers, the SBS mechanism can transfer large amounts of energy to a counter-propagating wave seeded only by Rayleigh scattering or amplified spontaneous emission, limiting the amount of amplification in the signal wave that can be extracted.

Thus, there is a need in the art for improved methods and systems related to high peak power fiber-based amplifiers.

SUMMARY OF THE INVENTION

According to the present invention, techniques related generally to the field of optical amplifiers and lasers are provided. More particularly, the present invention relates to a method and apparatus for amplifying laser pulses to high power for various applications including industrial applications such as trimming, marking, cutting, and welding. Merely by way of example, the invention has been applied to high peak power ytterbium-doped fiber laser amplifiers. However, the present invention has broader applicability and can be applied to other sources.

According to an embodiment of the present invention, a laser source is provided. The laser source includes a seed source adapted to generate a seed signal and an optical circulator having a first port coupled to the seed source, a second port, and a third port. The see source may emit a single frequency or a plurality of frequencies. In a particular embodiment, the linewidth of each of the plurality of frequencies is less than a Brillouin gain bandwidth (e.g., less than about 30 MHz). The seed source may be a semiconductor laser, a fiber laser, or a solid-state laser.

The laser source also includes an amplitude modulator characterized by a first side and a second side. The first side of the amplitude modulator is coupled to the second port of the optical circulator. The laser source further includes a first optical amplifier characterized by an input end coupled to the second side of the amplitude modulator and a reflective end having a spectral-domain reflectance filter and a second optical amplifier coupled to the third port of the optical circulator. In a specific embodiment, the laser source is adapted to provide a tunable, pulsed output.

According to another embodiment of the present invention, a method of providing a series of laser pulses is provided. The method includes providing a seed signal at a first port of an optical circulator, transmitting the seed signal to a first side of an amplitude modulator, and time-domain filtering the seed signal. The method also includes amplifying the pulse using a first optical amplifier, frequency-domain filtering the amplified pulse, and amplifying the frequency-domain filtered pulse using a second optical amplifier. In a particular embodiment, the seed signal is provided by a directly modulated semiconductor laser and includes one or more optical pulses having a frequency chirp substantially larger than a Brillouin gain bandwidth associated with an optical fiber. In an embodiment, the method also includes externally modulating the seed signal to generate one or more optical pulses, each of the optical pulses having a frequency chirp substantially larger than a Brillouin gain bandwidth associated with an optical fiber.

According to yet another embodiment of the present invention, a method of providing a series of laser pulses is provided. The method includes directly modulating a semiconductor laser to generate a seed signal including a plurality of optical pulses. Each of the plurality of optical pulses has a frequency chirp substantially larger than a Brillouin gain bandwidth associated with an optical fiber. The method also includes providing the seed signal to a first port of an optical circulator and time-domain filtering the seed signal a first time with an amplitude modulator optically coupled to the optical circulator. The method further includes amplifying the time-domain filtered seed signal in a double-pass optical amplifier optically coupled to the modulator to provide a time-domain filtered seed signal and time-domain filtering the amplified time-domain filtered seed signal a second time with the amplitude modulator.

According to a specific embodiment of the present invention, a method of generating laser pulses is provided. The method includes directly modulating a semiconductor laser to generate a plurality of optical pulses. Each of the plurality of pulses has a frequency chirp substantially larger than a Brillouin gain bandwidth associated with an optical fiber. The method also includes externally modulating each of the plurality of optical pulses to reduce a temporal length of each of the plurality of optical pulses. The plurality of optical pulses may include a train of pulses at a repetition rate of between about 0 and 100 kHz. Each of the plurality of optical pulses may be characterized by a single frequency or by a plurality of frequencies. In a particular embodiment, a linewidth of each of the plurality of frequencies is less than a Brillouin gain bandwidth of about 30 MHz.

According to another specific embodiment of the present invention, a method of generating laser pulses is provided. The method includes directly modulating a semiconductor laser to generate a plurality of optical pulses. Each of the plurality of pulses has a frequency chirp substantially larger than a Brillouin gain bandwidth associated with an optical fiber. The method also includes amplifying the plurality of optical pulses to generate a plurality of amplified optical pulses and externally modulating the plurality of amplified optical pulses to reduce a duration (e.g., a temporal length) of each of the plurality of amplified optical pulses. In a specific embodiment, optically pumping the optical fiber amplifier includes receiving pump energy from one or a plurality of semiconductor lasers. In another specific embodiment, the rare-earth doped optical fiber includes at least one of ytterbium, erbium, holmium, neodymium, thulium, or praseodymium.

Numerous benefits are achieved using the present invention over conventional techniques. For example, in an embodiment according to the present invention, high peak power, pulsed lasers suitable for laser-based processing are provided that utilize a compact architecture that is inexpensive in comparison to lasers with comparable performance characteristics. Moreover, in embodiments of the present invention, short pulses are generated with pulse characteristics that are tunable in real-time while maintaining pulse-to-pulse stability. Furthermore, in another embodiment according to the present invention, optical pulses can be shaped to optimize the temporal pulse profile for the particular application, or to maximize energy extraction efficiency in the laser system. Depending upon the embodiment, one or more of these benefits may exist. These and other benefits have been described throughout the present specification and more particularly below. Various additional objects, features and advantages of the present invention can be more fully appreciated with reference to the detailed description and accompanying drawings that follow.

DETAILED DESCRIPTION OF SPECIFIC EMBODIMENTS

Figure 1:
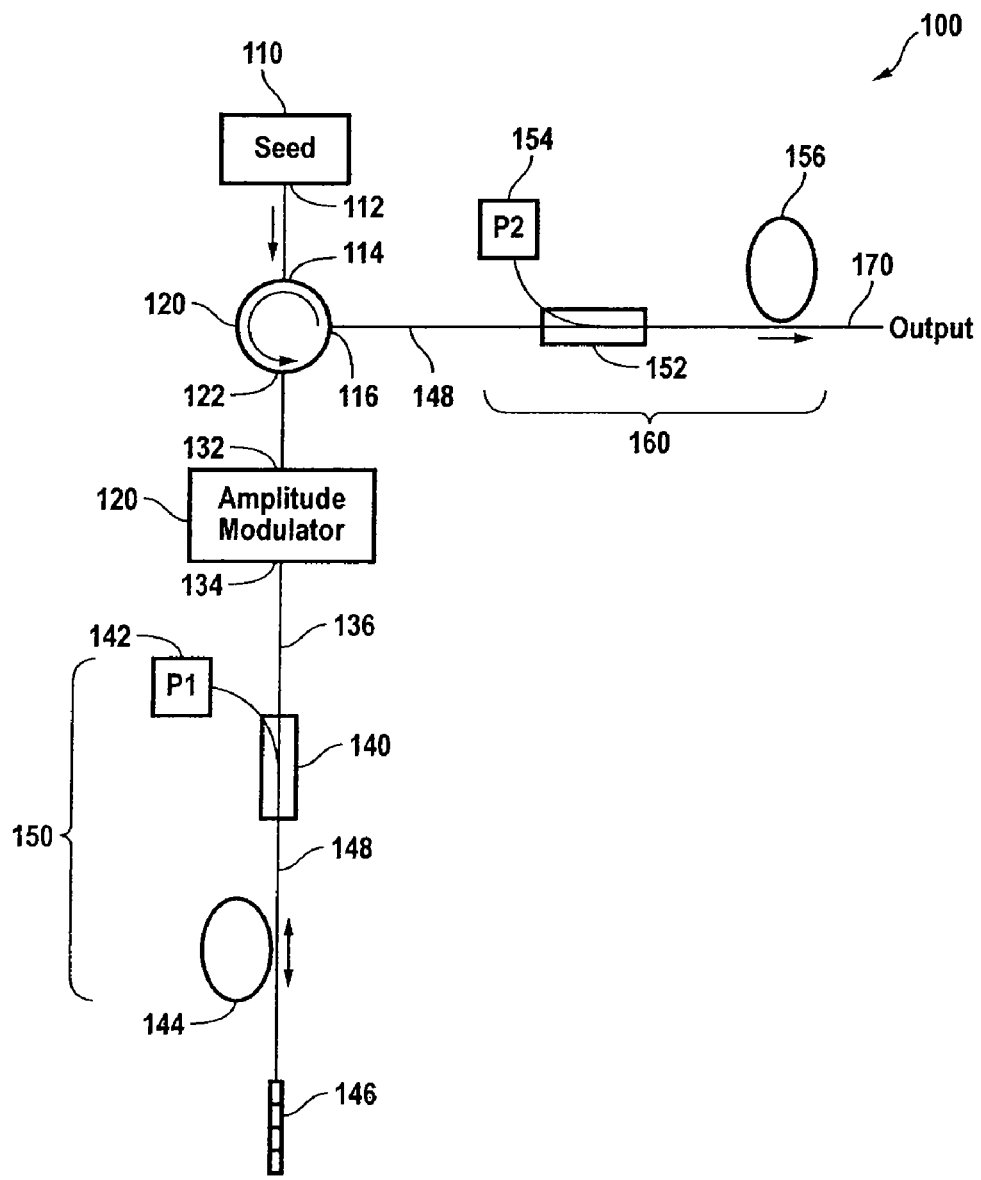
FIG. 1 is a simplified schematic illustration of a high power pulsed laser with tunable pulse characteristics using optical fiber amplifiers according to an embodiment of the present invention.

FIG. 1 is a simplified schematic illustration of a high power pulsed laser with tunable pulse characteristics using optical fiber amplifiers according to an embodiment of the present invention. The laser is configured to generate optical pulses. High power pulsed laser 100 includes a continuous wave (CW) seed source 110 that generates a seed signal that is injected into a first port 114 of an optical circulator 120. According to an embodiment of the present invention, the optical seed signal is generated by using a seed source 110 that is a continuous wave (CW) semiconductor laser. In a particular embodiment, the CW semiconductor laser is a fiber Bragg grating (FBG) stabilized semiconductor diode laser operating at a wavelength of 1032 nm with an output power of 20 mW. In another particular embodiment, the CW semiconductor laser is an external cavity semiconductor diode laser operating at a wavelength of 1064 nm with an output power of 100 mW. In alternative embodiments, the seed signal is generated by a compact solid-state laser or a fiber laser. One of ordinary skill in the art would recognize many variations, modifications, and alternatives.

After passing through the optical circulator 120, the seed signal exits from a second port 122 of the circulator 120 and impinges on a first side 132 of an optical amplitude modulator 130. Circulators are well known in the art and are available from several suppliers, for example, model OC-3-1064-PM from OFR, Inc. of Caldwell, N.J.

The optical amplitude modulator 130 is normally held in an "off" or low transmission state, in which the signal impinging on the modulator is substantially not transmitted. According to embodiments of the present invention, optical amplitude modulator provides amplitude modulation and time-domain filtering of the seed signal as well as filtering of the CW amplified spontaneous emission (ASE). In a particular embodiment, the length of the optical pulse is determined by the operation of the optical amplitude modulator 130, which may be an APE-type Lithium Niobate Mach-Zehnder modulator having a bandwidth >3 GHz at 1064 nm.

According to embodiments of the present invention, the optical amplitude modulator 130 is an electro-optic Mach-Zehnder type modulator, which provides the bandwidth necessary for generating short optical pulses. In other embodiments, the optical amplitude modulator 130 is a phase or frequency modulator with a suitable phase or frequency to amplitude converter, such as an edge optical filter, an extinction modulator, or an acousto-optic modulator.

In order to pass the seed signal, the optical amplitude modulator 130 is pulsed to the "on" state for a first time to generate an optical pulse along optical path 136. The pulse width and pulse shape of the optical pulse generated by the optical amplitude modulator 130 are controlled via by the modulator drive signal applied to the optical amplitude modulator 130. The optical pulse then passes for a first time through a first optical amplifier 150, where it is amplified. According to embodiments of the present invention, the amplitude modulator, driven by a time varying drive signal, provides time-domain filtering of the seed signal, thereby generating a laser pulse with predetermined pulse characteristics, including pulse width, pulse shape, and pulse repetition rate.

According to an embodiment of the present invention, the optical amplifier 150 is an optical fiber amplifier. Fiber amplifiers utilized in embodiments of the present invention include, but are not limited to rare-earth-doped single-clad, double-clad, or even multiple-clad optical fibers. The rare-earth dopants used in such fiber amplifiers include ytterbium, erbium, holmium, praseodymium, thulium, or neodymium. In a particular embodiment, all of the fiber-optic based components utilized in constructing optical amplifier 150 utilize polarization-maintaining single-mode fiber.

Referring to FIG. 1, in embodiments utilizing fiber amplifiers, a pump 142 is coupled to a rare-earth-doped fiber loop 144 through optical coupler 140. Generally, a semiconductor pump laser is used as pump 142. One of ordinary skill in the art would recognize many variations, modifications, and alternatives. In alternative embodiments, the optical amplifier 150 is a solid-state amplifier including, but not limited to, a solid-state rod amplifier, a solid-state disk amplifier or gaseous gain media.

In a particular embodiment, the optical amplifier 150 includes a 5 meter length of rare-earth doped fiber 144, having a core diameter of approximately 4.1 μm, and doped with ytterbium to a doping density of approximately $4 \times 10^{24}$ ions/m$^3$. The amplifier 150 also includes a pump 142, which is an FBG-stabilized semiconductor laser diode operating at a wavelength of 976 nm, and having an output power of 100 mW in an embodiment. In another particular embodiment, the pump 142 is a semiconductor laser diode operating at a wavelength of about 915 nm. In yet another particular embodiment, the pump 142 is a semiconductor laser diode operating at an output power of 450 mW or more. In a specific embodiment, the amplifier 150 also includes a pump to fiber coupler 140, which is a WDM pump combiner. In some embodiments, the double-pass optical amplifier 150 is constructed using rare-earth-doped optical fibers. Generally, the rare-earth-doped optical fibers are excited by one or more semiconductor pump lasers.

The signal emerging from optical amplifier 150 along optical path 148 then impinges on a reflecting structure 146, and is reflected back into optical amplifier 150. The signal passes for a second time through optical amplifier 150, wherein the signal is amplified. The reflecting structure 146 performs spectral domain filtering of the laser pulse and of the amplified spontaneous emission (ASE) propagating past optical path 148. Thus, the seed signal experiences both amplitude and time-domain modulation passing through amplitude modulator 130, and spectral-domain filtering upon reflection from reflecting structure 146.

In an embodiment, the reflecting structure 146 is a fiber Bragg grating (FBG) that is written directly in the fiber used as the optical amplifier 150. The periodicity and grating characteristics of the FBG are selected to provide desired reflectance coefficients as is well known in the art. Merely by way of example in a particular embodiment, the reflecting structure 146 is a FBG having a peak reflectance greater than 90%, and a center wavelength and spectral width closely matched to the output of the seed source 110.

The signal emerging from optical amplifier 150 along optical path 136 impinges on the second side 134 of the optical amplitude modulator 130, which is then pulsed to the "on" state a second time to allow the incident pulse to pass through. According to embodiments of the present invention, the timing of the second "on" pulse of the optical amplitude modulator 130 is synchronized with the first opening of the modulator 130 (first "on" pulse) to take account of the transit time of the signal through the amplifier 150 and the reflecting structure 146. After emerging from the first side of the optical amplitude modulator 130, the amplified pulse then enters the second port 122 of optical circulator 120, and exits from the third port 116 of optical circulator 120 along optical path 148.

The signal is then amplified as it passes through a second optical amplifier 160. As discussed in relation to FIG. 1, embodiments of the present invention utilize a fiber amplifier as optical amplifier 160, including a pump 154 that is coupled to a rare-earth-doped fiber loop 156 through an optical coupler 152. Generally, a semiconductor pump laser is used as pump 154, although pumping of optical amplifiers can be achieved by other means as will be evident to one of skill in the art. In a particular embodiment, the second optical amplifier 160 includes a 5 meter length of rare-earth doped fiber 156, having a core diameter of approximately 4.8 μm, and is doped with ytterbium to a doping density of approximately $6 \times 10^{24}$ ions/m$^3$. The amplifier 160 also includes a pump 154, which is an FBG-stabilized semiconductor laser diode operating at a wavelength of 976 nm, and having an output power of 500 mW. In another particular embodiment, the second optical amplifier 160 includes a 2 meter length of rare-earth doped fiber 156, having a core diameter of approximately 10 μm, and is doped with ytterbium to a doping density of approximately $1 \times 10^{26}$ ions/m$^3$. The amplifier 160 can also includes a pump 154, which is a semiconductor laser diode having an output power of 5 W.

In another particular embodiment, in order to pass the seed signal, the optical amplitude modulator 130 is pulsed once instead of twice. The optical amplitude modulator 130 is turned to the "on" state to generate the rising edge of the pulse propagating along optical path 136. This signal is then amplified a first time through optical amplifier 150. The signal then impinges on the reflecting structure 146 and is amplified a second time through optical amplifier 150. Now the signal emerging from optical amplifier 150 along optical path 136 impinges on the second side 134 of the optical amplitude modulator 130, which is subsequently turned to the "off" state. The pulse width is therefore given by the time duration during which the optical amplitude modulator 130 is held in the "on" state subtracted by the transit time of the signal through the amplifier 150 and the reflecting structure 146.

Although FIG. 1 illustrates the use of a single optical amplifier 160 coupled to the third port of the optical circulator 120, this is not required by the present invention. In alternative embodiments, multiple optical amplifiers are utilized downstream of the optical circulator 120 as appropriate to the particular applications. One of ordinary skill in the art would recognize many variations, modifications, and alternatives.

Figure 8A:
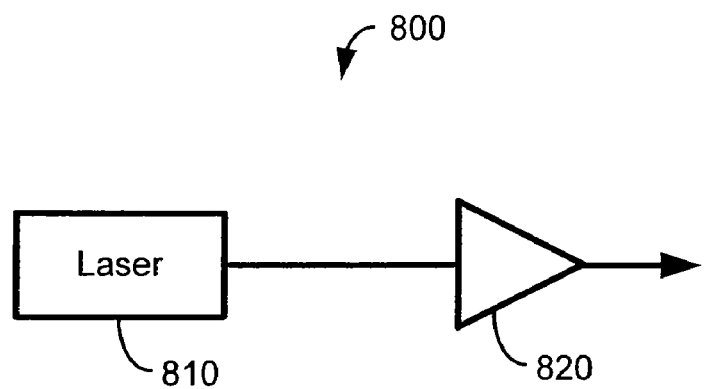
FIGS. 8A and 8B are simplified schematic illustrations of high power pulsed lasers according to embodiments of the present invention.
Figure 8B:
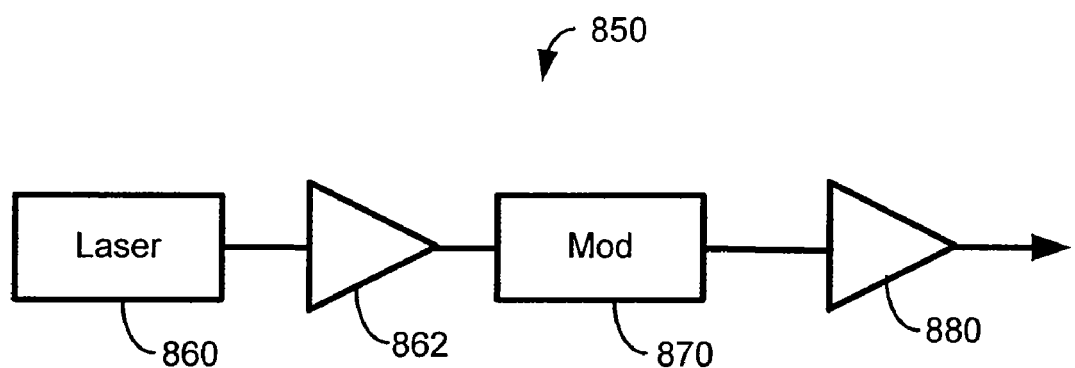

FIGS. 8A and 8B are simplified schematic illustrations of high power pulsed lasers according to embodiments of the present invention. In FIG. 8A, a high power pulsed laser 800 includes a pulsed seed source 810 that generates a seed signal, which is amplified by optical amplifier 820 The optical output pulse width is determined by the seed source pulse width. In FIG. 8B, a high power pulsed laser 850 includes a CW seed source 860 that generates a seed signal and a first optical amplifier 862 to amplify the seed signal. The high power pulsed laser 850 further comprises an optical amplitude modulator 870 to generate optical pulses, which are then amplified in a second optical amplifier 880. The optical output pulse width is determined by the optical modulator, that is, the optical output pulse width is determined by the electrical pulse width applied to the modulator and is independent of the seed signal. In some applications for the high power pulse laser illustrated in FIG. 8B, the first optical amplifier is not required, for example, if the seed power is high enough.

Figure 2:
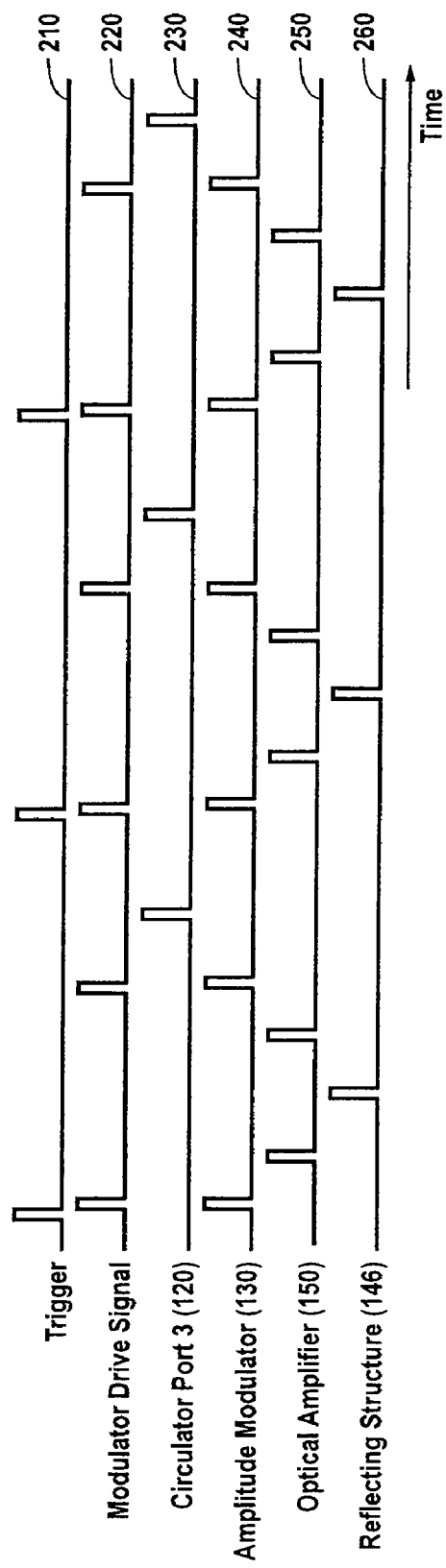
FIG. 2 is a simplified timing diagram illustrating electrical and optical pulses at different locations in a high power pulsed laser according to an embodiment of the present invention.

FIG. 2 is a simplified timing diagram illustrating electrical and optical pulses at different locations in a high power pulsed laser according to an embodiment of the present invention. Merely by way of example, FIG. 2 illustrates the timing of repetitive electrical drive signals to the amplitude modulator and optical pulses propagating through an embodiment of the invention as described in FIG. 1. Following an electrical trigger 210, a first electrical drive signal 220 is applied to the amplitude modulator to generate an optical pulse 240. After some propagation delay, the optical signal 250 passes through the optical amplifier a first time. The optical signal 260 then impinges on the reflecting structure and passes through the optical amplifier a second time 250. The optical pulses 240 are transmitted through the amplitude modulator a second time, which is driven electrically a second time 220 with the optical pulses 240. Finally the optical pulses 230 exit port 3 of the circulator after some propagation delay.

Utilizing embodiments of the present invention, high power pulsed laser sources are provided that generate streams of optical pulses with independently adjustable pulse characteristics including pulse width, peak power and energy, pulse shape, and pulse repetition rate. Merely by way of example, a particular embodiment of the present invention delivers output pulses at the output 170 of second optical amplifier 160 of more than 5 µJ per pulse at a pulse width of 10 ns and at a repetition rate of 10 kHz. Of course, other pulse characteristics are provided by alternative embodiments.

In the embodiments described above, the seed signal is modulated to provide a pulsed seed signal. Providing a pulsed seed signal minimizes ASE build-up caused by seed leakage and enables the operating power range of the seed source to be increased. The pulsed seed signal may be of a pulse width equal to or longer than the desired pulse width of overall pulsed laser source. Pulsing the seed can also increase the effective linewidth of the seed laser to reduce Stimulated Brillouin Scattering (SBS). Utilizing architecture similar to those presented in FIG. 1 and FIGS. 8A and 8B, streams of high power optical pulses can be generated. In high power lasers constructed with doped optical fibers, the peak power or energy per pulse is often limited by SBS. SBS strongly depends on the signal linewidth propagating in the optical fiber. The SBS gain is maximized for linewidth less than about 30-60 MHz and decreases progressively (e.g., approximately linearly) with the further widening of the linewidth. For example, for a laser linewidth of about 1-30 MHz, the SBS gain is at or near a maximum value, but for a linewidth of 30 GHz, the SBS gain is approximately 1000 times smaller. Therefore, to minimize SBS, embodiments of the present invention utilize an optical signal with an effective broad linewidth. Embodiments of the present invention are used to generate optical frequency chirp during the optical pulses as a means to obtain an effective broad linewidth.

In a semiconductor laser, a driving current waveform is substantially transformed into an amplitude modulated optical output waveform. Also, since the intrinsic optical properties of semiconductor lasers depend on the injection current and the instantaneous optical power, the optical carrier frequency is modulated as well, which is called chirp, according to:

$$v(t) = \frac{\alpha}{4\pi}\left[\frac{1}{P(t)}\frac{dP(t)}{dt} + kP(t)\right]. \tag{1}$$

The first term in equation (1) is called the transient chirp and is determined by the rate of change of the optical power (e.g., the rate of temporal variation of the optical power). The second term in equation (1) is called adiabatic chirp and is determined by the optical power. Equation (1) provides that the optical carrier frequency will be modified ("chirped") by any time dependency present in the optical power. Transient chirp may also be generated in external optical modulators, for example, Mach-Zehnder modulators, or electro-absorption modulators. Generally, adiabatic chirp is not generated in external optical modulators. The unitless parameter $\alpha$ is called the "chirp parameter" or the linewidth enhancement factor and can usually have a value in the range −1 to +5. The parameter k can typically have a value in the range of 2-6 GHz/mW.

Figure 3:
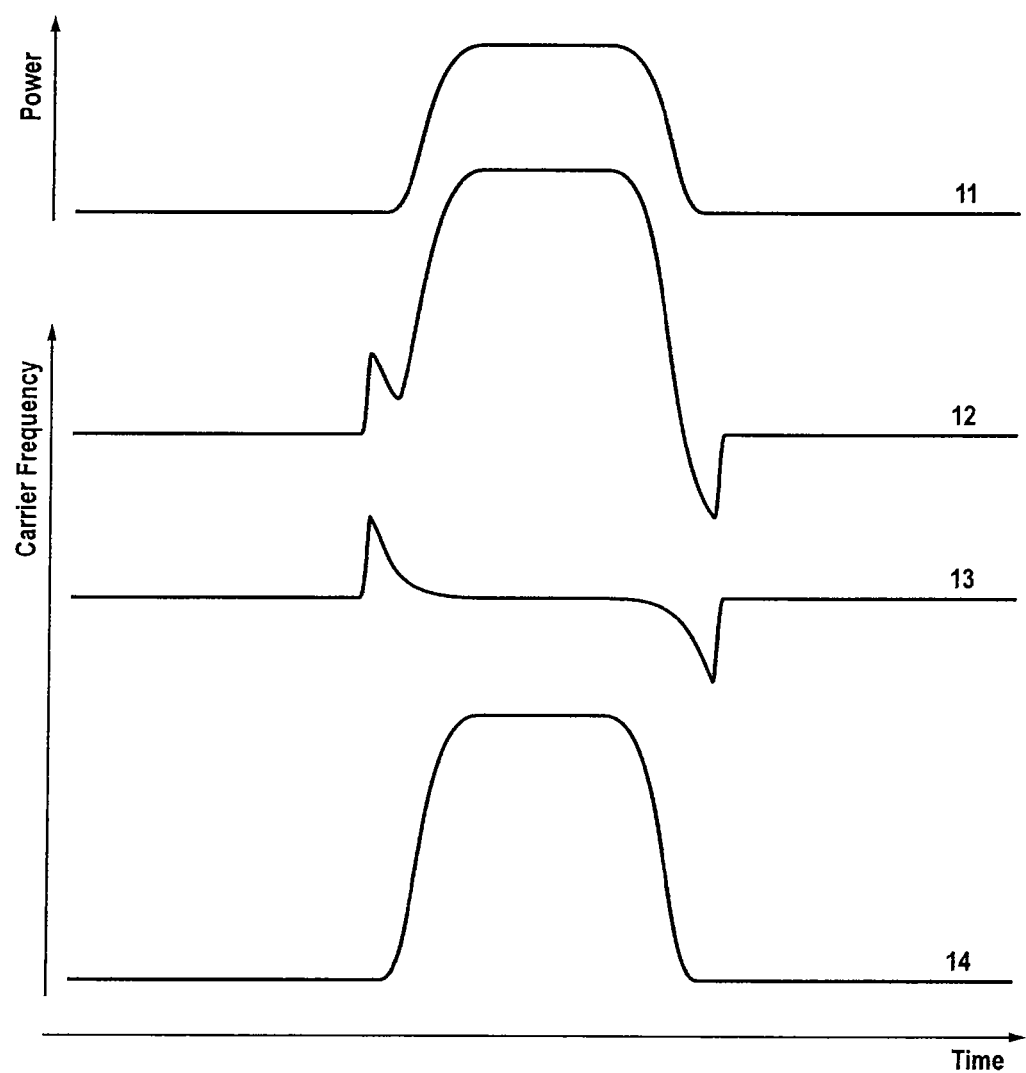
FIG. 3 illustrates the optical pulse shape and chirp for a conventional directly-modulated semiconductor laser seed.

Reference is now made to FIG. 3, illustrating the optical pulse shape and chirp for a conventional directly-modulated semiconductor laser. Curve 11 illustrates the output optical power waveform and is very similar to the current driving waveform. Curve 12 illustrates the total chirp given by the sum of the transient chirp 13 and the adiabatic chirp 14. In the case of an external optical modulator used to modulate the output power of a laser with a waveform similar to curve 11, only the transient chirp 13 is present.

The Continuous Wave (CW) output spectrum of the laser source can consist of a single carrier frequency, as found in Distributed Feedback (DFB) lasers, or a plurality of carrier frequencies, as found in Fabry-Perot or ring lasers. When a plurality of carriers is present, the chirp modulates each of them individually.

A chirped or modulated carrier frequency means that the numerical value of the carrier frequency varies during the pulse. For example, referencing once again curve 12 of FIG. 3, it may be possible that the carrier frequency between the center and the edge of the pulse varies by 10 GHz. In this particular example, it is noted that the carrier frequency in the center of the pulse does not substantially change. Therefore, most of the pulse energy is characterized by a fixed carrier frequency and the carrier frequency variations at the rising and falling edges of the pulse affect a substantially small fraction of the total energy of the pulse.

To minimize Stimulated Brillouin Scattering (SBS) in optical fibers, especially when signals are amplified to high peak power in optical fiber amplifiers, it would be advantageous if the carrier frequency would change during that part of the optical pulse wherein most of the energy is contained. In other words, a useful source characterized by reduced SBS would have substantially all of its energy distributed at different carrier frequencies at different times.

A high peak power signal in an optical fiber can lose energy through SBS to a back traveling parasitic signal at a carrier frequency approximately 10 GHz away. This back traveling parasitic signal can originate from spontaneous emission in an excited doped fiber or from spontaneous Brillouin scattering. The gain bandwidth of this process is about 30 MHz. In other words, each frequency in the forward propagating input signal can lose energy to a back-traveling wave at a carrier frequency of 10 GHz+/−15 MHz. If the input signal's optical carrier frequency is fixed most of the time, the back-traveling signal may be amplified during the whole pulse duration, which can be expressed as an amplification length. For example, if the pulse has a 20 ns duration, the SBS signal would be amplified and rob energy from the input signal during about a 20 ns interaction, or approximately a 4 m length of the fiber.

However, if the input signal's optical carrier frequency varies with time because of chirping, then any given frequency band of the parasitic SBS signal will only be amplified during that time over which the input signal's carrier frequency is about 10 GHz away. The total amplification may therefore be significantly smaller than in the fixed carrier frequency case. Each frequency of the input signal only provides SBS gain for a corresponding frequency in a back-traveling signal. For example, if the carrier frequency were chirped at a rate of 1 GHz/ns, then each 30 MHz band of the input signal will only amplify the SBS signal during a 30 ps window, or a 6 mm interaction length. The same 20 ns pulse as in the previous example would only amplify the SBS signal for 6 mm instead of 4 m.

Consider an input signal whose spectrum had an instantaneous spectral width larger than about 30 MHz, and which was chirped. In this case a parasitic signal with a spectral width of 30 MHz or less could be amplified by more than one 30 MHz spectral band of the input signal as the chirping process brings other 30 MHz portions of the spectrum into alignment (offset by 10 GHz) with the spectrum of the parasitic signal. If the parasitic signal had a spectral width greater than 30 MHz, the above argument would apply equally to each 30 MHz-wide component of the parasitic signal. However this effect can be canceled out by the lower spectral power density of a signal having a larger spectral bandwidth for a given total power, since Brillouin gain coefficient is proportional to the product of the spectral power densities of the signal and parasitic beams, measured over two 30 MHz linewidths separated by 1 GHz. Nonetheless to minimize SBS, it is advantageous to limit the input signal spectral width to a value of the order of the SBS gain bandwidth or less. This could be achieved with DFB lasers. Alternatively, the signal power can also be spread over a plurality of carrier frequencies, as generated by Fabry-Perot lasers, and each carrier frequency would advantageously have a width less than the SBS gain bandwidth.

Consequently, embodiments of the present invention provide a method to minimize the effects of SBS on high peak power pulses in optical fibers. The method includes the generation of an optical signal having a frequency chirp during the portion of the pulses containing the highest energy instead of having the frequency chirp located during times with low energy. The inventors have done numerous simulations and have discovered that a frequency chirp rate higher than 30 MHz/ns provides significant benefits. Accordingly, some embodiments include a frequency chirp rate higher than 1 GHz/ns. Additionally, the inventors have discovered that having a total chirp of at least 1 GHz and preferably 10 GHz provides advantages not available using other conventional techniques. The examples that follow are not intended to limit the scope of embodiments of the present invention, but to merely describe various methods and systems in accordance with embodiments of the present invention.

Figure 4:
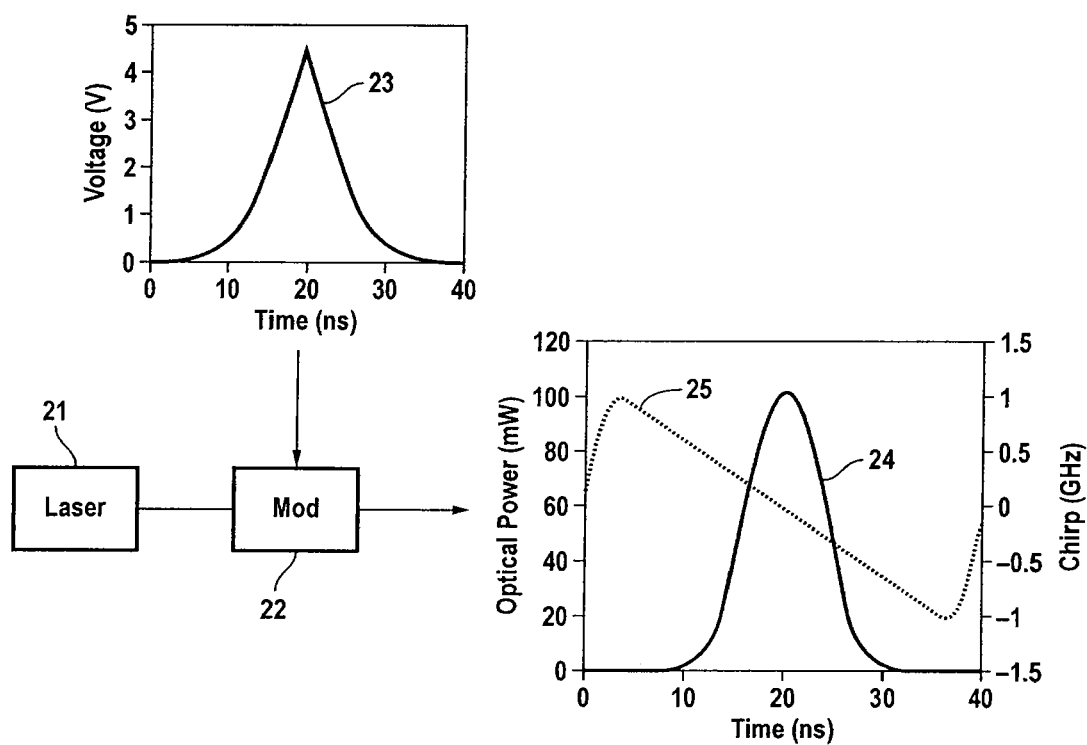
FIG. 4 is a simplified schematic illustration of pulse shapes generated using a seed source using a laser and an external modulator according to an embodiment of the present invention.

Reference is now made to FIG. 4, which illustrates a first embodiment of a seed source using a CW laser 21 and an external amplitude modulator 22 receiving CW light from the laser. The CW laser can be a fiber laser, a semiconductor laser, a solid-state laser, or the like. The external modulator can be a Lithium Niobate March-Zehnder modulator with a chirp parameter different than zero. The modulator is used both for generating the optical pulse and for chirping the optical carrier frequency. The modulator's chirp parameter and the drive waveform 23 are chosen appropriately such that the optical pulse 24 with a peak power of 100 mW has a chirp 25, comprising the transient chirp in this case, varying at the pulse peak with a slope of about 0.1 GHz/ns. Also in this example, the chirp is more than 1 GHz over a period of time containing most of the pulse energy. The appropriate optical waveform resulting in the targeted chirp could be calculated with the help of equation (1). Then the drive waveform can be determined using the known modulator's transfer function.

Figure 5:
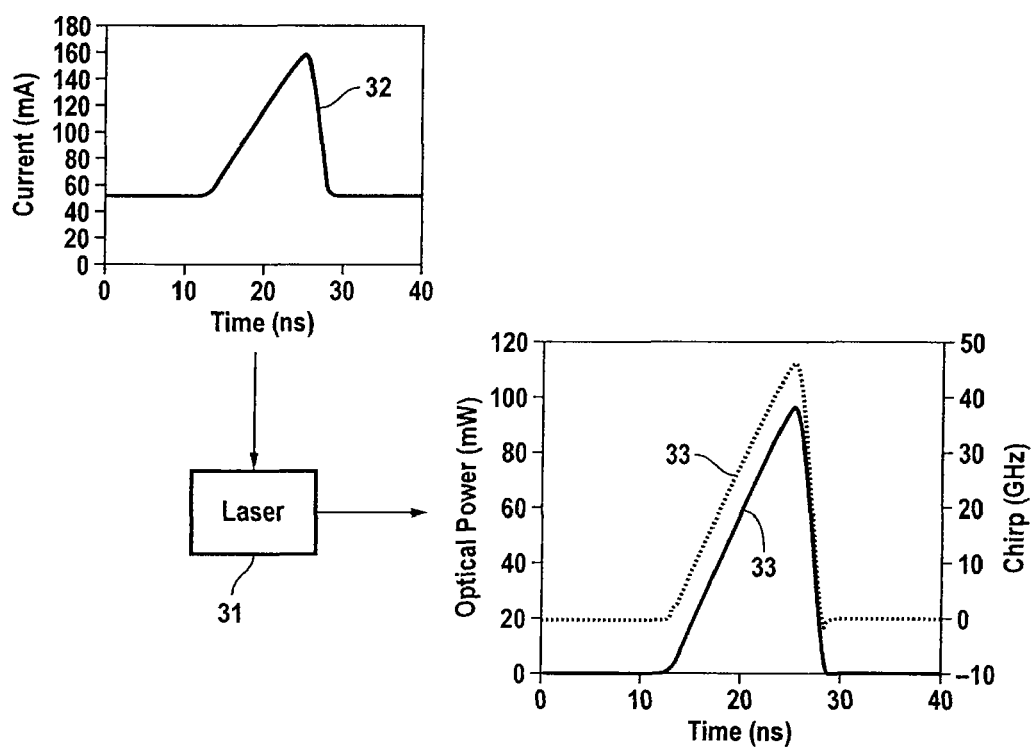
FIG. 5 is a simplified schematic illustration of pulse shapes generated using a seed source using a directly-modulated semiconductor laser according to another embodiment of the present invention.

Reference is now made to FIG. 5, which illustrates a second embodiment of a seed source using a directly-modulated semiconductor laser 31. In contrast with external modulators, a semiconductor laser also possesses an adiabatic chirp component that can be exploited to generate a chirp waveform that varies almost linearly across an optical pulse. The drive current waveform 32 is chosen appropriately to generate an optical pulse 33 and a chirp 34 that varies almost linearly across the pulse. In semiconductor lasers, the output optical pulse and therefore the adiabatic chirp follow closely the drive current waveform. Other variations are also possible, but the illustrated embodiment provides chirp that varies at a fast rate, approximately 9 GHz/ns in this example, around the pulse peak power of 100 mW. Also, the chirp varies by several tens of GHz across the pulse. A further advantage of such a pulse shape is that it can compensate in part for pulse distortion happening in high power fiber amplifiers. Such a distortion can happen when a fast leading edge pulse extracts the stored energy in an amplifier too rapidly. A slower leading edge can be employed to ameliorate this effect.

Figure 6:
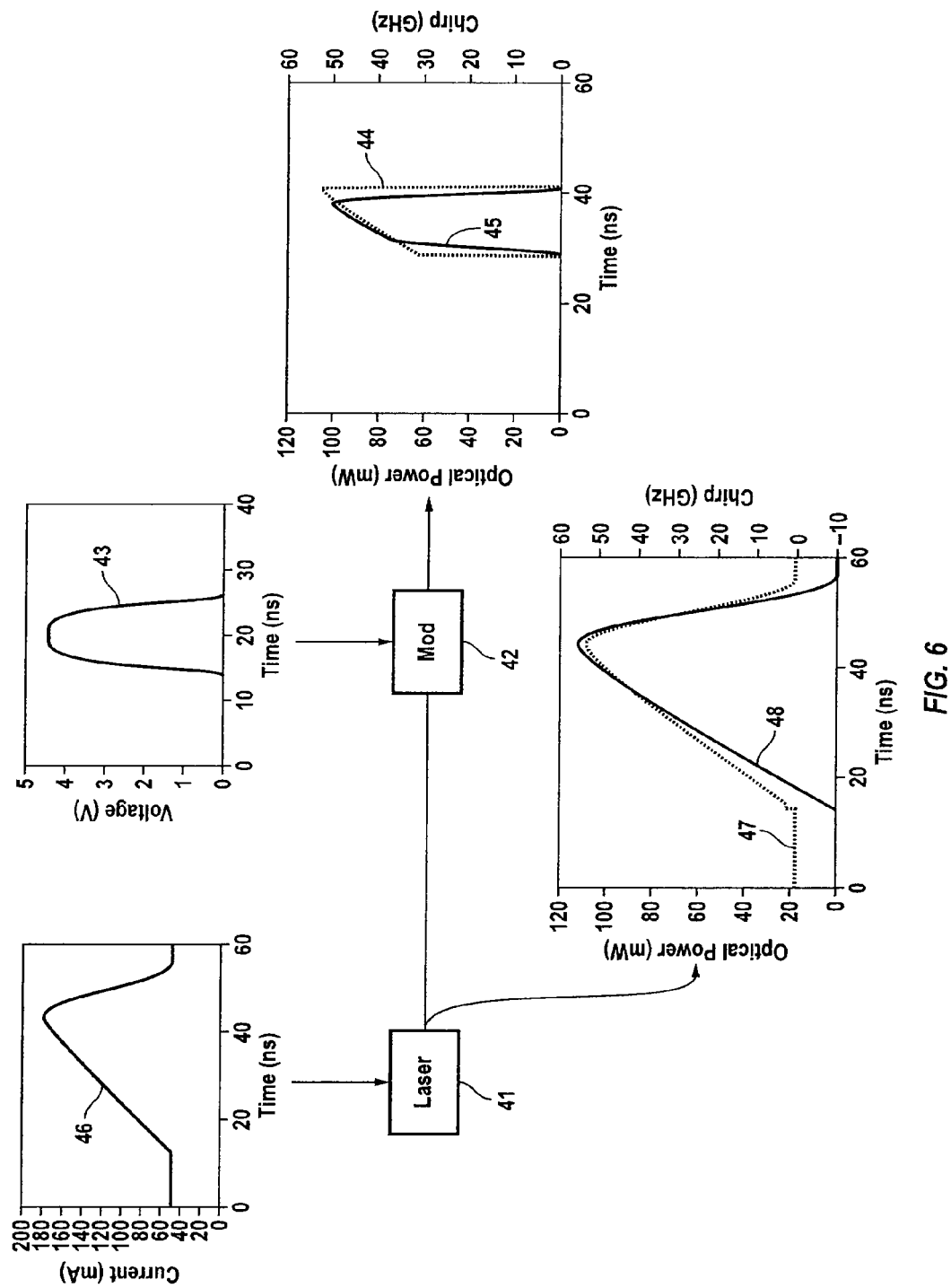
FIG. 6 is a simplified schematic illustration of pulse shapes generated using a seed source using a directly-modulated semiconductor laser and an external modulator according to yet another embodiment of the present invention.

Reference is now made to FIG. 6, which illustrates a third embodiment of a seed source using a directly-modulated semiconductor laser 41 and a modulator to generate optical pulses. The drive current waveform 46 is chosen appropriately to generate an optical pulse 48 and a chirp 47 that varies almost linearly across the pulse as described in FIG. 5. Other variations are also possible, but the illustrated embodiment provides chirp that varies at a fast rate, approximately 9 GHz/ns in this example, around the pulse peak power of 100 mW. Also, the chirp varies by several tens of GHz across the pulse. The pulse generated by the directly-modulated semiconductor laser has a width larger than the intended output pulse width.

An external modulator 42, driven by voltage waveform 43, receives this pulse and slices a narrower pulse out of it as illustrated by pulse 45. In this example, the semiconductor laser pulse width is approximately 40 ns and the modulator slices it to about 10 ns. The external modulator thus serves as a gate to the initially generated pulse from the directly-modulated laser. As explained in reference to FIG. 4, most external modulators would also generate chirping on the optical carrier frequency. This frequency chirp would be added to the chirp generated by the directly-modulator semiconductor laser. This effect can be used to increase or decrease the total chirp in the output signal according to the type of modulator used. In other embodiments, the external modulator is advantageously chirpless to minimize the impact of the modulator on the output frequency chirp. A chirpless modulator can be produced for example by using a Mach-Zehnder modulator in a push-pull modulation technique, such that only the chirp produced by the directly-modulated semiconductor laser is gated at the output of the seed source 44.

Methods and systems for generating a pulsed seed source are especially attractive when the directly-modulated semiconductor laser suffers from significant ringing at the rising or falling edges of the optical pulses. The ringing depends on the rate of change of the rising or falling edges and also on the semiconductor laser design. While the ringing may be associated with advantageous amounts of chirp, the associated amplitude variations may be difficult or impossible to compensate for elsewhere in the system. The external modulator may therefore be used to remove the ringing at the edges and to produce cleaner pulses. For example, the directly-modulated semiconductor laser pulse width can be larger than 100 ns, or larger than 1000 ns, even though the desired output pulse width is much smaller, of the order of 5 to 50 ns. The larger 1000 ns width could be used advantageously for applications requiring multiple closely spaces pulses. In this example, the multiple pulses could be gated with the modulator during a single directly-modulated semiconductor laser pulse. As an example, an application could require that three 10 ns pulses be generated with 100 ns spacing between them for a total pulse train of 230 ns. Advantageously, a semiconductor laser pulse width larger than 230 ns, for example 1000 ns or more, could be used.

Figure 7:
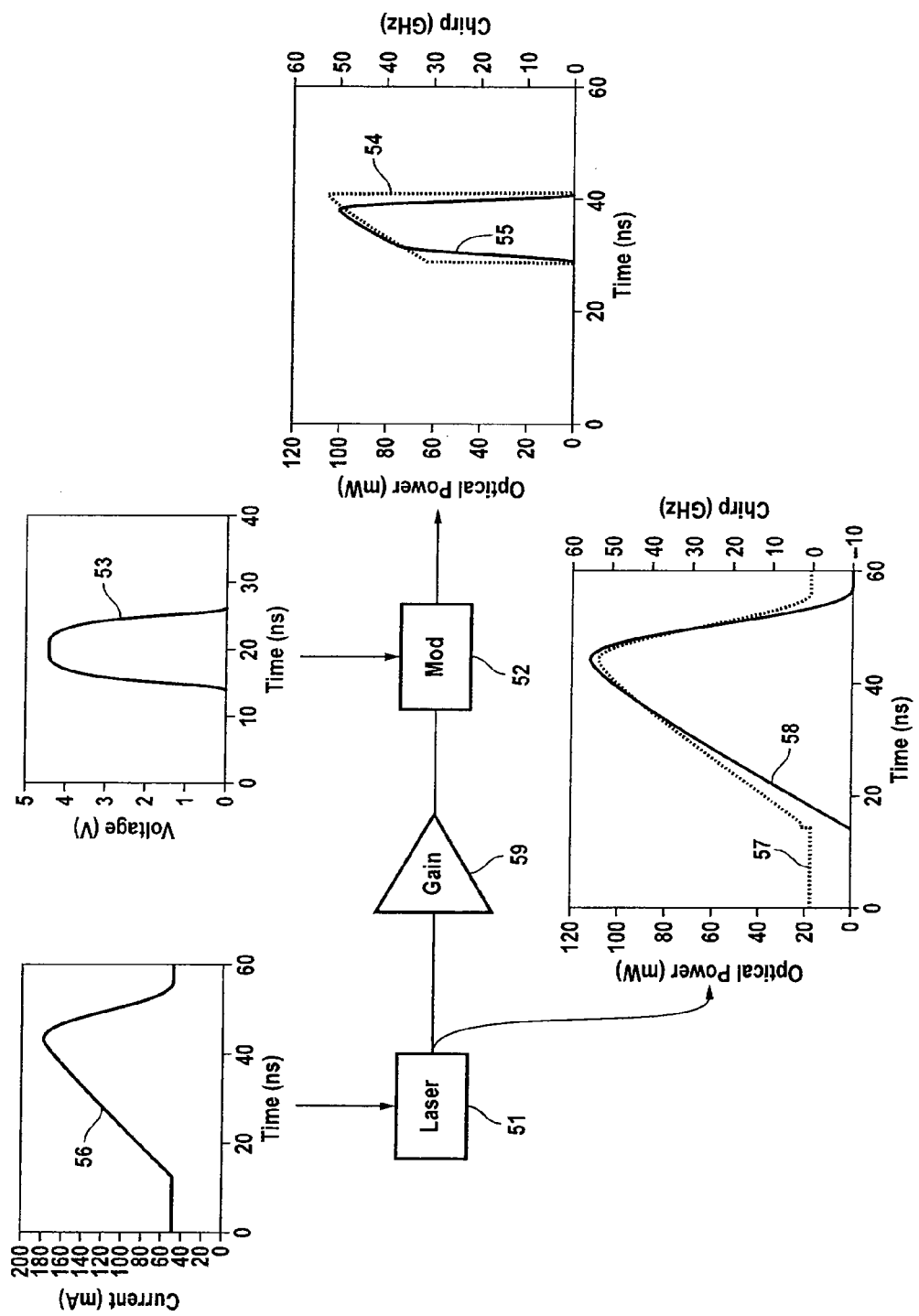
FIG. 7 is a simplified schematic illustration of pulse shapes generated using a seed source using an amplified directly-modulated semiconductor laser and an external modulator according to another embodiment of the present invention.

Reference is now made to FIG. 7, which illustrates a fourth embodiment of a seed source using a directly-modulated semiconductor laser 51 and an external modulator to generate optical pulses, which could have higher power than illustrates in FIG. 6. The drive current waveform 56 is chosen appropriately to generate an optical pulse 58 and a chirp 57 that varies almost linearly across the pulse. Other variations are also possible, but the illustrated embodiment provides a chirp that varies at a fast rate, approximately 9 GHz/ns in this example, around the pulse peak power of 100 mW. Also, the chirp varies by several tens of GHz across the pulse. The pulse generated by the directly-modulated semiconductor laser has a width larger than the intended seed source pulse width. An optical amplifier 59 receives the pulse and amplifies it to high peak power. The optical amplifier can be an optical fiber amplifier. An external modulator 52, driven by voltage waveform 53, receives this pulse and slices a narrower pulse out of it as illustrated by pulse 55. The external modulator thus serves as a gate to the initially generated pulse from the directly-modulated laser. In a specific embodiment, the external modulator is chirpless, as can be produced for example by using a Mach-Zehnder modulator in a push-pull modulation technique, such that only the chirp produced by the directly-modulated semiconductor laser is gated at the output of the seed source 54.

According to various embodiments of the present invention, methods and systems adapted to reduce or minimize SBS in optical fiber are provided. The illustrated embodiments may be used to inject trains of optical pulses in one or a plurality of optical amplifiers to amplify these pulse trains to high peak power. The optical amplifiers can include lengths of rare-earth-doped optical fiber and optical pumping structures. Such a configuration is sometimes denoted a Master Oscillator Power Amplifier (MOPA). Furthermore, embodiments have been illustrated for convenience without limitation in the context of the MOPA described in FIG. 2, but are readily applicable to any other MOPA configurations especially as described by FIG. 1. In a double-pass configuration as illustrated in FIG. 1, chirping and gating could be achieved in any of the first or second pass as those experienced in the art would recognize.

According to some embodiments of the present invention, methods and systems are provided that result in the generation of sequences of optical pulses, which may not be equally separated in time. Moreover, the pulse widths and pulse energies are individually tailored in a predetermined manner from pulse to pulse. Furthermore, it will be recognized that although the above description discussed the generation of a single optical pulse, embodiments of the present invention provide for the generation of multiple pulses by repeating the single pulse a multiplicity of times. These multiple pulses may include an arbitrary train of optical pulse sequences.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A method of providing a series of laser pulses, the method comprising:
   directly modulating a semiconductor laser to generate a seed signal including a plurality of optical pulses, each of the plurality of optical pulses having a frequency chirp substantially larger than a Brillouin gain bandwidth associated with an optical fiber;
   providing the seed signal to a first port of an optical circulator;
   time-domain filtering the seed signal a first time with an amplitude modulator optically coupled to the optical circulator;
   amplifying the time-domain filtered seed signal in a double-pass optical amplifier optically coupled to the modulator to provide a time-domain filtered seed signal; and
   time-domain filtering the amplified time-domain filtered seed signal a second time with the amplitude modulator.

2. The method of claim 1 wherein directly modulating the semiconductor laser comprises driving the semiconductor laser with a time varying current waveform.

3. The method of claim 2 wherein the time varying current waveform comprises a current ramp.

4. The method of claim 3 wherein the current ramp is longer than 200 ns.

5. The method of claim 4 wherein the current ramp imposes a frequency chirp rate larger than 1 GHz/ns.

6. The method of claim 1 wherein time-domain filtering the seed signal comprises modulating a drive signal of the amplitude modulator.

7. The method of claim 1 wherein the frequency chirp is larger than about 1 GHz.

8. The method of claim 7 wherein the frequency chirp is larger than about 10 GHz.

9. The method of claim 1 wherein amplifying the time-domain filtered seed signal comprises passing the time-domain filtered seed signal through an optically pumped optical fiber amplifier including a length of rare-earth-doped optical fiber.

10. The method of claim 9 wherein optically pumping the optical fiber amplifier comprises receiving pump energy from one or a plurality of semiconductor lasers.

* * * * *